United States Patent
Goto et al.

(10) Patent No.: US 10,373,863 B2
(45) Date of Patent: Aug. 6, 2019

(54) METHOD OF MANUFACTURING POROUS BODY, POROUS BODY, METHOD OF MANUFACTURING DEVICE, DEVICE, METHOD OF MANUFACTURING WIRING STRUCTURE, AND WIRING STRUCTURE

(71) Applicant: FUJIFILM Corporation, Tokyo (JP)

(72) Inventors: Yuichiro Goto, Haibara-gun (JP); Tadashi Oomatsu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/468,911

(22) Filed: Mar. 24, 2017

(65) Prior Publication Data

US 2017/0200639 A1    Jul. 13, 2017

Related U.S. Application Data

(63) Continuation of application No. PCT/JP2015/077449, filed on Sep. 29, 2015.

(30) Foreign Application Priority Data

Sep. 30, 2014   (JP) ................................ 2014-201568

(51) Int. Cl.
    *H01L 23/52*      (2006.01)
    *H01L 21/768*      (2006.01)
    (Continued)

(52) U.S. Cl.
    CPC .... *H01L 21/76817* (2013.01); *B29C 37/0053* (2013.01); *B29C 44/02* (2013.01);
    (Continued)

(58) Field of Classification Search
    CPC ......... H01L 21/76817; H01L 21/76877; H01L 23/53228; H01L 23/5283; H01L 23/5226;
    (Continued)

(56) References Cited

U.S. PATENT DOCUMENTS

2007/0275556 A1    11/2007   Bietsch et al.
2014/0327183 A1    11/2014   Mori et al.
(Continued)

FOREIGN PATENT DOCUMENTS

JP      S61-137711 A     6/1986
JP      H03-136051 A     6/1991
(Continued)

OTHER PUBLICATIONS

O. Larlus, et al., "Silicalite-1/polymer films with low-k dielectric constants", Applied Surface Science, 2004, pp. 155-160, vol. 226.
(Continued)

*Primary Examiner* — Vu A Vu
(74) *Attorney, Agent, or Firm* — Sughrue Mion, PLLC

(57) ABSTRACT

Provided are a method of manufacturing a porous body capable of easily manufacturing a porous body, a porous body, a method of manufacturing a device, a device, a method of manufacturing a wiring structure, and a wiring structure.
A photocurable composition including a condensing gas and a polymerizable compound is applied to a substrate or a mold, the photocurable composition is sandwiched between the substrate and the mold and then the photocurable composition is irradiated with light to cure the photocurable composition, and the mold is released from a surface of the cured photocurable composition.

10 Claims, 2 Drawing Sheets

SUBSTRATE CONVEYANCE DIRECTION
(y DIRECTION)

(51) Int. Cl.
| | |
|---|---|
| *H01L 21/027* | (2006.01) |
| *H01L 21/3205* | (2006.01) |
| *H01L 23/532* | (2006.01) |
| *B29C 44/02* | (2006.01) |
| *B29C 44/12* | (2006.01) |
| *H01L 21/02* | (2006.01) |
| *H01L 23/522* | (2006.01) |
| *H01L 23/528* | (2006.01) |
| *B29C 37/00* | (2006.01) |
| *B29K 33/00* | (2006.01) |
| *B29K 105/00* | (2006.01) |
| *B29L 31/34* | (2006.01) |
| *B29K 105/04* | (2006.01) |

(52) U.S. Cl.
CPC ............ *B29C 44/12* (2013.01); *H01L 21/027* (2013.01); *H01L 21/02118* (2013.01); *H01L 21/02203* (2013.01); *H01L 21/3205* (2013.01); *H01L 21/768* (2013.01); *H01L 21/76807* (2013.01); *H01L 21/76877* (2013.01); *H01L 23/5226* (2013.01); *H01L 23/5283* (2013.01); *H01L 23/532* (2013.01); *H01L 23/5329* (2013.01); *H01L 23/53228* (2013.01); *B29C 44/1219* (2013.01); *B29K 2033/12* (2013.01); *B29K 2105/0002* (2013.01); *B29K 2105/0094* (2013.01); *B29K 2105/041* (2013.01); *B29K 2105/045* (2013.01); *B29K 2909/02* (2013.01); *B29K 2995/0006* (2013.01); *B29L 2031/3406* (2013.01); *H01L 2924/0002* (2013.01)

(58) Field of Classification Search
CPC ........... H01L 23/5329; H01L 21/76807; H01L 21/02118; H01L 21/02203; B29C 44/12; B29C 44/02; B29K 2995/0006; B29K 2105/0002

USPC ........................................................ 257/759
See application file for complete search history.

(56) References Cited

U.S. PATENT DOCUMENTS

| | | | |
|---|---|---|---|
| 2015/0158268 A1 | 6/2015 | Koike et al. | |
| 2015/0315322 A1* | 11/2015 | Chiba | ..................... G03F 7/029 |
| | | | 264/447 |

FOREIGN PATENT DOCUMENTS

| | | |
|---|---|---|
| JP | 10-284600 A | 10/1998 |
| JP | 2007-507860 A | 3/2007 |
| JP | 2008-168480 A | 7/2008 |
| TW | 201425067 A | 7/2014 |
| WO | 2013/069466 A1 | 5/2013 |
| WO | 2014/112495 A1 | 7/2014 |

OTHER PUBLICATIONS

International Search Report for PCT/JP2015/077449 dated Dec. 28, 2015 [PCT/ISA/210].
Written Opinion for PCT/JP2015/077449 dated Dec. 28, 2015 [PCT/ISA/237].
Office Action dated Dec. 5, 2017, from the Japanese Patent Office in counterpart Japanese Application No. 2016-552043.
Landis, S. et al., "Three dimensional on 300 mm wafer scale nano imprint lithography processes", Microelectronic Engineering, 2013, vol. 110, pp. 198-203.
International Preliminary Report on Patentability issued from the International Bureau in counterpart International Application No. PCT/JP2015/077449, dated Apr. 13, 2017.
Office Action dated Oct. 4, 2018 from the Taiwanese Patent Office in counterpart Taiwanese Application No. 104131343.
Office Action dated Jun. 12, 2018, from the Intellectual Property Office of Taiwan in counterpart TW Application No. 104131343.

* cited by examiner

SUBSTRATE CONVEYANCE DIRECTION
(y DIRECTION)

METHOD OF MANUFACTURING POROUS BODY, POROUS BODY, METHOD OF MANUFACTURING DEVICE, DEVICE, METHOD OF MANUFACTURING WIRING STRUCTURE, AND WIRING STRUCTURE

CROSS-REFERENCE TO RELATED APPLICATIONS

This application is a Continuation of PCT International Application No. PCT/JP2015/077449 filed on Sep. 29, 2015, which claims priority under 35 U.S.C § 119(a) to Japanese Patent Application No. 2014-201568 filed on Sep. 30, 2014. Each of the above application(s) is hereby expressly incorporated by reference, in its entirety, into the present application.

BACKGROUND OF THE INVENTION

1. Field of the Invention

The present invention relates to a method of manufacturing a porous body, a porous body, a method of manufacturing a device, a device, a method of manufacturing a wiring structure, and a wiring structure.

2. Description of the Related Art

In recent years, in order to cope with microfabrication and high integration of a semiconductor device, a multilayer structure wiring has become a mainstream. A Cu wiring has been applied to prevent propagation delay of a signal flowing in a wiring. In addition, as the method of forming a wiring, a dual damascene method has become a mainstream (JP1998-284600A (JP-H10-284600A)).

The dual damascene method is a technology for forming a wiring layer by forming a via trench structure in an insulating film by a method such as etching and filling the via trench structure with a wiring material such as Cu by an electrolytic plating method. For the insulating film, a low dielectric constant material is employed to suppress signal delay and as the low dielectric constant material, a porous silica film and the like are used.

In addition, in recent years, there has been proposed a method of using an imprint method for forming a via trench structure in an insulating film (Microelectronic Engineering, 110 (2013) 198).

The imprint method is a technology for transferring a fine pattern to a material by pressing a pattern-formed metal mold (generally also referred to as a mold or a stamper) against the material. As the imprint method, a method called a thermal imprint method or a photoimprint method has been proposed based on the transfer method thereof.

In the thermal imprint method, a mold is pressed against a thermoplastic resin heated to a temperature equal or higher than the glass transition temperature thereof, then the thermoplastic resin is cooled to a temperature equal or lower than the glass transition temperature, and the mold is released from the resin to thereby transfer a microstructure onto the resin on the substrate.

On the other hand, in the photoimprint method, a curable composition is photocured by photoirradiation through a light transmitting mold or a light transmitting substrate and then the mold is peeled off to thereby transfer a fine pattern to the photocured product. In this method, since imprinting is performed on an uncured product, heating under high pressure and high temperature is not required and a fine pattern can be easily formed. Further, the method makes imprinting possible at room temperature and thus can be applied to precision processing field of an ultrafine pattern for production of semiconductor integrated circuits and the like.

For example, as a photocurable composition for imprinting, silsesquioxane and the like are proposed (JP2008-168480A).

SUMMARY OF THE INVENTION

In order to prevent propagation delay of a signal flowing in a wiring, it has been desired for an insulating layer to have a low dielectric constant and in order to make an insulating layer have a low dielectric constant, the use of a porous film or the like as a low dielectric constant material has been investigated.

Here, a pattern-formed body made of a porous film has been conventionally manufactured by etching an insulating film made of a porous material, which has required time and effort.

On the other hand, in the imprint method, by using a multistage mold having a via trench structure, a pattern-formed body (insulating layer) having a via trench structure can be easily formed.

However, it is difficult to manufacture a porous body by the conventional imprint method.

Accordingly, an object of the present invention is to provide a method of manufacturing a porous body capable of easily manufacturing a porous body, a porous body, a method of manufacturing a device, a device, a method of manufacturing a wiring structure, and a wiring structure.

As a result of intensive investigations conducted by the present inventors, it has been found that when a photocurable composition including a condensing gas and a polymerizable compound is used, the condensing gas is volatilized at the time of curing the photocurable composition, and pores are formed in the region in which the condensing gas is dissolved so that a porous body can be manufactured, and thus the present invention has been completed. The present invention provides the followings.

<1> A method of manufacturing a porous body comprising: applying a photocurable composition including a condensing gas and a polymerizable compound to a substrate or a mold; sandwiching the photocurable composition between the substrate and the mold and then irradiating the photocurable composition with light to cure the photocurable composition; and releasing the mold from a surface of the cured photocurable composition.

<2> The method of manufacturing a porous body according to <1>, in which as the photocurable composition, a composition including a polymerizable compound having a $\Delta$SP, which is represented by the following Equation (1), of 15 $(J/cm^3)^{1/2}$ or less is used:

$\Delta$SP=|SP value of polymerizable compound−SP value of condensing gas included in photocurable composition|     (1).

<3> The method of manufacturing a porous body according to <1> or <2>, in which the condensing gas is dissolved to be saturated in the photocurable composition.

<4> The method of manufacturing a porous body according to any one of <1> to <3>, in which the mold has a pattern.

<5> The method of manufacturing a porous body according to any one of <1> to <4>, in which the mold has a pattern having a line width of 50 nm or less.

<6> The method of manufacturing a porous body according to any one of <1> to <5>, in which the mold has a multistage roughness pattern.

<7> The method of manufacturing a porous body according to any one of <1> to <6>, in which in an atmosphere of the presence of one or more gases selected from a condensing gas and a helium gas, the photocurable composition applied to the substrate or the mold is sandwiched between the substrate and the mold.

<8> A porous body comprising: a (meth)acrylic resin, in which the specific dielectric constant at 25° C. is 3.4 or less.

<9> The porous body according to <8>, in which the porous body has a pattern.

<10> The porous body according to <8> or <9>, in which the porous body has a multistage roughness pattern.

<11> A method of manufacturing a device comprising: the method of manufacturing a porous body according to any one of <1> to <7>.

<12> A device comprising: the porous body according to any one of <8> to <10>.

<13> A method of manufacturing a wiring structure comprising: the method of manufacturing a porous body according to any one of <1> to <7>.

<14> A wiring structure comprising: the porous body according to any one of <8> to <10>; and a wiring layer.

According to the present invention, it is possible to provide a method of manufacturing a porous body capable of easily manufacturing a porous body, a porous body, a method of manufacturing a device, a device, a method of manufacturing a wiring structure, and a wiring structure.

DESCRIPTION OF THE PREFERRED EMBODIMENTS

Figure 1:
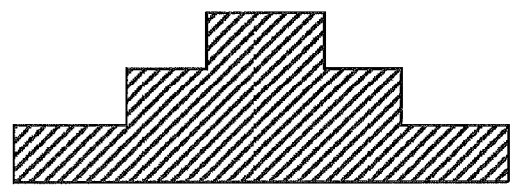
FIG. 1 is a schematic view showing an example of a multistage roughness pattern.

Hereinafter, the contents of the present invention are described in detail.

The numerical range which is shown by "to" used in the present specification means the range including the numerical values described before and after "to" as the lower limit and the upper limit, respectively.

In the present specification, the expression "(meth)acrylate" represents acrylate and methacrylate, the expression "(meth)acryl" represents acryl and methacryl, and the expression "(meth)acryloyl" represents acryloyl and methacryloyl.

In the present specification, the expression "imprinting" preferably refers to transferring a pattern having a size of 1 nm to 10 mm, and more preferably refers to transferring a pattern having a size of 10 nm to 100 μm (nanoimprinting).

In the denotation of a group (atomic group) in the present specification, the denotation without substitution or unsubstitution includes a group not having a substituent together with a group having a substituent. For example, the expression "alkyl group" includes not only an alkyl group (unsubstituted alkyl group) not having a substituent but also an alkyl group (substituted alkyl group) having a substituent.

In the present specification, the expression "light" includes not only light having a wavelength in the ultraviolet region, near-ultraviolet region, far-ultraviolet region, visible region, infrared region, and the like, and electromagnetic waves, but also radiation. Examples of the radiation include microwaves, electron beams, EUV, and X-rays. In addition, laser rays such as 248 nm excimer laser, 193 nm excimer laser, and 172 nm excimer laser can be also used. These sorts of light may be monochromatic light obtained after being allowed to pass through an optical filter (light having a single wavelength), or may be light including a plurality of light components with different wavelengths (composite light).

The mass average molecular weight and number average molecular weight in the present invention are molecular weights measured by gel permeation chromatography (GPC) unless otherwise specified. GPC can be performed using HLC-8020GPC (manufactured by Tosoh Corporation) and using three columns of TSKgel Super Multipore HZ-H (manufactured by Tosoh Corporation, 4.6 mm ID×15 cm) connected in series such that a solid content is isolated from the obtained polymer by removing a solvent and the obtained solid content is diluted to 0.1% by mass with tetrahydrofuran to measure the molecular weight. GPC can be performed under the conditions that the sample concentration is 0.35% by mass, the flow rate is 0.35 mL/min, the amount of sample injected is 10 μL, the measurement temperature is 40° C., and an RI detector is used.

In the present specification, the total solid content refers to the total mass of all components remaining when a solvent is removed from the entire composition of the composition.

Solids, liquids and gases in the present specification refer to solids, liquids and gases at 0.1 MPa and 25° C. unless otherwise specified.

In the present specification, the viscosity is a value measured by using a RE-80L type rotary viscometer, manufactured by TOKI SANGYO CO., LTD., at 25±0.2° C. The rotation speed during the measurement is 100 rpm at a viscosity of 0.5 mPa·s or more and less than 5 mPa·s, 50 rpm at a viscosity of 5 mPa·s or more and less than 10 mPa·s, 20 rpm at a viscosity of 10 mPa·s or more and less than 30 mPa·s, and 10 rpm at a viscosity of 30 mPa·s or more and less than 60 mPa·s, respectively.

The method of manufacturing a porous body of the present invention includes applying a photocurable composition including a condensing gas and a polymerizable compound to a substrate or a mold, sandwiching the photocurable composition between the substrate and the mold and then irradiating the photocurable composition with light to cure the photocurable composition, and releasing the mold from a surface of the cured photocurable composition.

According to the present invention, when the photocurable composition including a condensing gas and a polymerizable compound is used, the condensing gas is volatilized at the time of curing the photocurable composition, and pores are formed in the region in which the condensing gas has been dissolved so that a porous body can be manufactured. In addition, in the case of using a mold having a pattern, a porous body having a pattern can be manufactured.

In the present specification, the porous body refers to a structure in which water molecules can freely enter the structure from the outside and which has an opening portion in which the diameter of the pore is (the diameter of the pore in the present invention means the diameter of the maximum inscribed circle) is smaller than 100 nm and pores in which the maximum depth from the opening portion is larger than the diameter of the opening portion. Whether the sample is a porous body or not can be confirmed by observing the cross section of the sample with a scanning electron microscope.

<Photocurable Composition>

First, the photocurable composition used in the method of manufacturing a porous body of the present invention is described.

The photocurable composition used in the method of manufacturing a porous body of the present invention includes a condensing gas and a polymerizable compound.

<<Condensing Gas>>

In the present invention, the condensing gas means a gas having a pressure of 0.05 to 1 MPa for achieving gas-liquid equilibrium at 25° C.

The boiling point of the condensing gas is preferably 15° C. to 30° C. at the atmospheric pressure (0.1 MPa).

The condensing gas may have a polymerizable group.

Examples of the condensing gas include hydrocarbon having 1 to 4 carbon atoms which may be substituted with a halogen atom. Specific examples of the condensing gas include 2,2-dichloro-1,1,1-trifluoroethane, 1-chloro-1,1-difluoroethane, 1,1,1,2-tetrafluoroethane, 1,1,1,2,3,3,3-pentafluoropropane, 1,1,1,2,2,3,4,5,5,5-decafluoropentane, 1,1,1,2,2,3,3,4,4,5,5,6,6-tridecafluorooctane, 1-chloro-1,2,2,2-tetrafluoroethane, difluoromethane, 1,1,1-trifluoroethane, 1,1,1,3,3-pentafluoropropane, 1,1,2,2,3,3,4-heptafluorocyclopentane, 2,3,3,3-tetrafluoro-1-propene, and 2-butene.

As the method of preparing the photocurable composition including the condensing gas, a method including leaving the photocurable composition to stand for a predetermined period of time in the closed space in which the condensing gas is present, or the like may be used. The condensing gas diffuses into the photocurable composition and is finally in a state in which the condensing gas is uniformly dissolved in the composition.

In addition, according to the Henry's law, when the partial pressure of the condensing gas present in the atmosphere is increased, the amount of dissolution can be increased.

In the present invention, it is preferable that the condensing gas is dissolved to be saturated in the photocurable composition. It is more preferable that when the photocurable composition is applied to a substrate or a mold having a pattern, the condensing gas is dissolved to be saturated in the photocurable composition under the pressure and temperature conditions at the time of the application.

In the present invention, the expression "the condensing gas is dissolved to be saturated" means a state in which when the photocurable composition is placed in an airtight container filled with the condensing gas and the mass of the photocurable composition placed in the airtight container is measured with an electronic balance, a change in the mass of the photocurable composition is 0.1% by mass/min or less.

<<Polymerizable Compound>>

In the present invention, the polymerizable compound is not particularly limited within the range not departing the gist of the present invention. Examples of a polymerizable group of the polymerizable compound include an ethylenically unsaturated bond-containing group, an epoxy group, and an oxetanyl group. Examples of the ethylenically unsaturated bond-containing group include a (meth)acrylate group, a (meth)acrylamide group, a vinyl group, an allyl group, and a vinyl ether group. Preferable is a (meth)acrylate group. That is, the polymerizable compound is preferably a (meth)acrylate compound.

The number of polymerizable groups is preferably 1 to 6, more preferably 1 to 3, and even more preferably 1 or 2.

Examples of the polymerizable compound include a compound having 1 to 6 ethylenically unsaturated bond-containing groups; an epoxy compound; an oxetane compound; a vinyl ether compound; a styrene derivative; propenyl ether; and butenyl ether. Specific examples of the polymerizable compound include those described in paragraphs 0020 to 0098 of JP2011-231308A, the content of which is incorporated into the present specification. As the polymerizable compound, a (meth)acrylate compound is preferable.

The content of the polymerizable compound in the total composition excluding solvent and the condensing gas is preferably 70% to 99.9% by mass, more preferably 80% to 99.9% by mass, and even more preferably 85% to 99.9% by mass. In the case of using two or more types of polymerizable compounds, it is preferable that the total amount thereof is within the above range.

The compound having 1 to 6 ethylenically unsaturated bond-containing groups (monofunctional to hexafunctional polymerizable compounds) is described.

Specific examples of the compound having one ethylenically unsaturated bond-containing group include methyl (meth)acrylate, ethyl(meth)acrylate, butyl(meth)acrylate, N-vinylpyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol (meth)acrylate, 2-hydroxybutyl(meth) acrylate, 2-hydroxyethyl(meth)acrylate, 2-hydroxypropyl (meth)acrylate, 4-hydroxybutyl(meth)acrylate, acrylic acid dimer, benzyl(meth)acrylate, 1- or 2-naphthyl(meth)acrylate, butoxyethyl(meth)acrylate, cetyl(meth)acrylate, ethylene oxide (hereinafter, referred to as "EO")-modified cresol (meth)acrylate, dipropylene glycol(meth)acrylate, ethoxylated phenyl(meth)acrylate, isooctyl(meth)acrylate, cyclohexyl(meth)acrylate, isobornyl(meth)acrylate, dicyclopentanyl(meth)acrylate, dicyclopentanyl oxyethyl(meth) acrylate, isomyristyl(meth)acrylate, lauryl(meth)acrylate, methoxy dipropylene glycol(meth)acrylate, methoxy tripropylene glycol(meth)acrylate, methoxy polyethylene glycol (meth)acrylate, methoxy triethylene glycol(meth)acrylate, neopentyl glycol benzoate(meth)acrylate, nonyl phenoxy polyethylene glycol(meth)acrylate, nonyl phenoxy polypropylene glycol(meth)acrylate, octyl(meth)acrylate, paracumyl phenoxy ethylene glycol(meth)acrylate, epichlorohydrin (hereinafter, referred to as "ECH")-modified phenoxy acrylate, phenoxy ethyl(meth)acrylate, phenoxy diethylene glycol(meth)acrylate, phenoxy hexaethylene glycol(meth) acrylate, phenoxy tetraethylene glycol(meth)acrylate, polyethylene glycol(meth)acrylate, polyethylene glycol-polypropylene glycol(meth)acrylate, polypropylene glycol (meth)acrylate, stearyl(meth)acrylate, EO-modified succinate(meth)acrylate, tribromo phenyl(meth)acrylate, EO-modified tribromo phenyl(meth)acrylate, tridodecyl (meth)acrylate, p-isopropenyl phenol, N-vinylpyrrolidone, and N-vinyl caprolactam.

It is preferable that the compound having one ethylenically unsaturated bond-containing group is a monofunctional (meth)acrylate compound from the viewpoint of photocurability. Among monofunctional (meth)acrylate compounds, from the viewpoint of dry etching resistance, monofunctional (meth)acrylates having an aromatic structure and/or an alicyclic hydrocarbon structure are preferable, and monofunctional (meth)acrylate having an aromatic structure is even more preferable.

Among monofunctional (meth)acrylates having an aromatic structure and/or an alicyclic hydrocarbon structure, benzyl(meth)acrylate, 2-phenoxyethyl acrylate, benzyl (meth)acrylate having a substituent on an aromatic ring (preferably an alkyl group having 1 to 6 carbon atoms as a substituent, an alkoxy group having 1 to 6 carbon atoms, and a cyano group), 1- or 2-naphthyl(meth)acrylate, 1- or 2-naphthylmethyl(meth)acrylate, 1- or 2-naphthylethyl (meth)acrylate, dicyclopentanyl(meth)acrylate, dicyclopentanyloxyethyl(meth)acrylate, isobornyl(meth)acrylate, and adamantyl(meth)acrylate are preferable, and 2-phenoxyethyl acrylate, benzyl(meth)acrylate, benzyl (meth)acrylate having a substituent on an aromatic ring, and a monofunctional (meth)acrylate compound having a naphthalene structure are more preferable.

In the present invention, it is also preferable that a compound having two or more ethylenically unsaturated bond-containing groups is used as the polymerizable compound.

Examples of the compound having two or more ethylenically unsaturated bond-containing groups include diethylene glycol monoethyl ether(meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter, referred to as "PO")-modified neopentyl glycol diacrylate, caprolactone-modified hydroxypivalic acid ester neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester di(meth)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylol propane di(meth)acrylate, tripropylene glycol di(meth)acrylate, EO-modified tripropylene glycol di(meth)acrylate, triglycerol di(meth)acrylate, dipropylene glycol di(meth)acrylate, divinyl ethylene urea, divinyl propylene urea, o-, m-, or p-xylylene di(meth)acrylate, 1,3-adamantane diacrylate, and norbornane dimethanol diacrylate.

Among these, particularly, difunctional (meth)acrylates such as neopentyl glycol di(meth)acrylate, 1,9-nonanediol di(meth)acrylate, tripropylene glycol di(meth)acrylate, tetraethylene glycol di(meth)acrylate, hydroxypivalic acid neopentyl glycol di(meth)acrylate, polyethylene glycol di(meth)acrylate, o-, m- or p-benzene di(meth)acrylate, and o-, m- or p-xylylene di(meth)acrylate are suitably used in the present invention.

In addition, it is also possible to use difunctional to hexafunctional (meth)acrylate compounds having an aromatic structure and/or an alicyclic hydrocarbon structure. For example, a polyfunctional (meth)acrylate compound containing an aromatic group (preferably a phenyl group and a naphthyl group) and having 2 to 4 (meth)acrylate groups may be used. Specifically, the compound shown below and the like may be used.

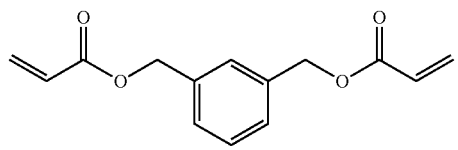 [SMILES: C=CC(=O)OCc1cccc(COC(=O)C=C)c1]

Examples of the epoxy compound include polyglycidyl esters of polybasic acids, polyglycidyl ethers of polyhydric alcohols, polyglycidyl ethers of polyoxyalkylene glycols, polyglycidyl ethers of aromatic polyols, hydrogenated compounds of polyglycidyl ethers of aromatic polyols, urethane polyepoxy compounds, and epoxidated polybutadienes. One of these compounds may be used alone or two or more of these compounds may be used as a mixture. As the epoxy compound, those described in paragraphs 0053 of JP2009-73078A and paragraphs 0055 of JP2009-73078A may be employed. These compounds may be used alone or may be used in combination of two or more thereof.

The method of manufacturing the epoxy compounds is not particularly limited but these compounds can be synthesized with reference to, for example, Organic Synthesis II in Experimental Chemistry Series 4th ed., Vol. 20, pp. 213-, 1992, Maruzen Publishing Co., Ltd., Ed. by Alfred Hasfner, The chemistry of heterocyclic compounds-Small Ring Heterocycles part 3 Oxiranes, John & Wiley and Sons, An Interscience Publication, New York, 1985, Yosimura, "Adhesion", Vol. 29, No. 12, p. 32, 1985, Yoshimura, "Adhesion", Vol. 30, No. 5, p. 42, 1986, Yoshimura, "Adhesion", Vol. 30, No. 7, p. 42, 1986, JP1999-100378A (JP-H11-100378A), and JP2906245B and JP2926262B.

As the vinyl ether compound, a known vinyl ether compound can be appropriately selected. For examples, those described in paragraphs 0057 of JP2009-73078A may be employed. These vinyl ether compounds can be synthesized by, for example, the method described in Stephen. C. Lapin, Polymers Paint Colour Journal. 179 (4237), 321 (1988), that is, through reaction of a polyhydric alcohol or a polyvalent phenol with acetylene, or through reaction of a polyhydric alcohol or a polyvalent phenol with a halogenated alkyl vinyl ether. These compounds may be used alone or in combination of two or more thereof.

Examples of the styrene derivative include styrene, p-methylstyrene, p-methoxystyrene, β-methylstyrene, p-methyl-β-methylstyrene, α-methylstyrene, p-methoxy-β-methylstyrene, and p-hydroxystyrene.

In the present invention, as the polymerizable compound, a maleimide compound may be used. As the maleimide compound, those described in JP2013-46003A can be preferably employed.

In the present invention, as the polymerizable compound, a polymerizable compound having a silicon atom and/or fluorine atom can be used.

As a polymerizable group of the polymerizable compound having a silicon atom and/or fluorine atom, a (meth)acrylate group is preferable. The number of polymerizable groups is preferably 1 or 2 and more preferably 1.

As the polymerizable compound having a fluorine atom, a compound having a fluorine-containing group selected from a fluoroalkyl group and a fluoroalkyl ether group is preferable.

As the fluoroalkyl group, a fluoroalkyl group having 2 to 20 carbon atoms is preferable, and a fluoroalkyl group having 4 to 8 carbon atoms is more preferable. Preferable examples of the fluoroalkyl group include a trifluoromethyl group, a pentafluoroethyl group, a heptafluoropropyl group, a hexafluoroisopropyl group, a nonafluorobutyl group, a tridecafluorohexyl group, a heptadecafluorooctyl group.

The fluoroalkyl ether group is preferably a fluoroalkyl ether group having a trifluoromethyl group and is more preferably a fluoroalkyl ether group containing a perfluoroethylene oxy group or a perfluoropropylene oxy group. A fluoroalkyl ether unit having a trifluoromethyl group such as —(CF(CF$_3$)CF$_2$O)— and/or a fluoroalkyl ether group having a trifluoromethyl group at the terminal thereof is preferable.

Examples of the polymerizable compound having a fluorine atom include trifluoroethyl(meth)acrylate, pentafluoroethyl(meth)acrylate, (perfluorobutyl)ethyl(meth)acrylate, perfluorobutyl-hydroxypropyl(meth)acrylate, (perfluorohexyl)ethyl(meth)acrylate, octafluoropentyl(meth)acrylate, perfluorooctylethyl(meth)acrylate, tetrafluoropropyl(meth)acrylate, hexafluoropropyl(meth)acrylate, 2,2,3,3,4,4-hexafluoropentane di(meth)acrylate, and 2,2,3,3,4,4,5,5-octafluorohexane di(meth)acrylate.

As the polymerizable compound having a fluorine atom, for example, those described in paragraphs 0022 and 0023 of WO2010/137724A can be referred to and the content thereof is incorporated into the present specification.

As the compound having a silicon atom, for example, those described in JP2012-2310733A can be preferably employed.

In addition, in the present invention, the photocurable composition may not substantially include the polymerizable compound having a silicon atom and/or a fluorine atom.

In the present invention, it is preferable that the polymerizable compound includes a polymerizable compound having a ΔSP, which is represented by the following Equation (1), of 15 (J/cm$^3$)$^{1/2}$ or less, (hereinafter, also referred to as a polymerizable compound (A)).

$$\Delta SP = |SP \text{ value of polymerizable compound} - SP \text{ value of condensing gas included in photocurable composition}| \quad (1)$$

As a difference (ΔSP) between the SP value of the polymerizable compound and the SP value (Solubility Parameter) of the condensing gas becomes smaller, the amount of the condensing gas dissolved becomes larger. Therefore, the pore size increases and the film structure becomes rough.

That is, in the case of obtaining a porous body having a large pore size, a polymerizable compound having a small ΔSP is preferably used. In the case of obtaining a porous body having a small pore size, a polymerizable compound having a large ΔSP value is preferably used.

In the present invention, the ΔSP of the polymerizable compound (A) is preferably 15 (J/cm$^3$)$^{1/2}$ or less, more preferably 12 (J/cm$^3$)$^{1/2}$ or less, and even more preferably 9 (J/cm$^3$)$^{1/2}$ or less. The lower limit of ΔSP may be, for example, 1 (J/cm$^3$)$^{1/2}$ or more and also may be 3 (J/cm$^3$)$^{1/2}$ or more. For example, in the case of using 1,1,1,3,3-pentafluoropropane (SP value=13 (J/cm$^3$)$^{1/2}$) as the condensing gas, the SP value of the polymerizable compound (A) is preferably 28 (J/cm$^3$)$^{1/2}$ or less, more preferably 25 (J/cm$^3$)$^{1/2}$ or less, and even more preferably 22 (J/cm$^3$)$^{1/2}$ or less. The lower limit is preferably, for example, 13 (J/cm$^3$)$^{1/2}$ or more and more preferably 14 (J/cm$^3$)$^{1/2}$ or more.

In addition, in the case of applying the porous body to the formation of a wiring structure, the ΔSP of the polymerizable compound (A) is preferably 1 to 12 (J/cm$^3$)$^{1/2}$ and more preferably 5 to 9 (J/cm$^3$)$^{1/2}$.

The SP value used in the present invention is a value measured by the Hoy method. The Hoy method is referred to the documents of H. L. Hoy: J. Paint Tech., 42 (540), 76 to 118 (1970), and SP value Basics/Applications and Calculation Method, (Yamamoto, Information Mechanism Co., Ltd., 2005). However, in the particular case in which the SP value cannot be measured by the methods described in the documents, other methods may be used for measurement.

The total of the polymerizable compound (A) in the total polymerizable compound included in the photocurable composition is preferably 50% to 100% by mass with respect to the total polymerizable compound. The lower limit is more preferably, for example, 60% by mass or more and even more preferably 80% by mass or more. The upper limit may be, preferably, for example, 95% by mass or less. When the content of the polymerizable compound (A) is within the above range, a porous body having a low specific dielectric constant is easily obtained. Within the range, in the case in which the total polymerizable compound included in the photocurable composition is substantially constituted of only the polymerizable compound (A), a porous body having a lower specific dielectric constant is easily obtained. Regarding the expression "the total polymerizable compound included in the photocurable composition is substantially constituted of only the polymerizable compound (A)", for example, it is preferable that 99% by mass or more of the total polymerizable compound is constituted of the polymerizable compound (A), it is more preferable that 99.9% by mass or more of the total polymerizable compound is constituted of the polymerizable compound (A), and it is even more preferable that the total polymerizable compound is constituted of the polymerizable compound (A).

The total of the polymerizable compound having one polymerizable group in the total polymerizable compound included in the photocurable composition is preferably 0% to 60% by mass with respect to the total polymerizable compound. The lower limit may be, for example, 1% by mass or more. The upper limit is more preferably 50% by mass or less and even more preferably 40% by mass or less.

In addition, the total of the polymerizable compound having two polymerizable groups is preferably 40% to 100% by mass with respect to the total polymerizable compound. The lower limit is more preferably 50% by mass or more and even more preferably 60% by mass or more. For example, the upper limit may be 99% by mass or less.

The total of the polymerizable compound having an alicyclic hydrocarbon structure and/or an aromatic structure in the total polymerizable compound included in the photocurable composition is preferably 10% to 100% by mass with respect to the total polymerizable compound. The lower limit is more preferably, for example, 20% by mass or more and even more preferably 30% by mass or more. The upper limit is more preferably 85% by mass or less and even more preferably 80% by mass or less.

<<Photopolymerization Initiator>>

It is preferable that the photocurable composition includes a photopolymerization initiator.

Any photopolymerization initiator can be used as long as the photopolymerization initiator is a compound which produces activated species for polymerizing the above-described polymerizable compound by photoirradiation. As the photopolymerization initiator, a radical polymerization initiator and a cationic polymerization initiator are preferable and a radical polymerization initiator is more preferable. In addition, in the present invention, a plurality of photopolymerization initiators may be used in combination.

As the radical photopolymerization initiator, for example, commercially available initiators may be used. Examples of these photopolymerization initiators that may be preferably used include those described in paragraph 0091 of JP2008-105414A. Among these, an acetone-based compound, an acylphosphine oxide-based compound, and an oxime ester-based compound are preferable from the viewpoint of curing sensitivity and absorption properties. Examples of commercially available products include IRGACURE OXE-01, IRGACURE OXE-02, IRGACURE 127, IRGACURE 819, IRGACURE 379, IRGACURE 369, IRGACURE 754, IRGACURE 1800, IRGACURE 651, IRGACURE 907, LUCIRIN TPO, and DAROCUR 1173 (all manufactured by BASF SE).

The content of the photopolymerization initiator is preferably 0.01% to 15% by mass, more preferably 0.1% to 12% by mass, and even more preferably 0.2% to 7% by mass with respect to the total composition excluding solvent. The photocurable composition may include only one photopolymerization initiator or two or more photopolymerization initiators. In the case of the photocurable composition including two or more photopolymerization initiators, it is preferable that the total amount thereof is within the above range.

<<Surfactant>>

The photocurable composition may contain a surfactant. It is preferable that the surfactant is a nonionic surfactant.

The nonionic surfactant is a compound having at least one hydrophobic portion and at least one nonionic hydrophilic portion. The hydrophobic portion and the hydrophilic portion each may be present at the terminal of the molecule or inside the molecule. The hydrophobic portion is constituted of a hydrophobic group selected from a hydrocarbon group, a fluorine-containing group, and a Si-containing group, and the number of carbon atoms in the hydrophobic portion is preferably 1 to 25, more preferably 2 to 15, even more preferably 4 to 10, and most preferably 5 to 8. It is preferable that the nonionic hydrophilic portion has at least one group selected from the group consisting of an alcoholic hydroxyl group, a phenolic hydroxyl group, an ether group (preferably a polyoxyalkylene group or a cyclic ether group), an amide group, an imido group, a ureido group, a urethane group, a cyano group, a sulfonamide group, a lactone group, a lactam group, and a cyclocarbonate group. The nonionic surfactant may be any of hydrocarbon-based, fluorine-based, Si-based and fluorine-Si-based nonionic surfactants and is more preferably a fluorine-based or Si-based nonionic surfactant and even more preferably a fluorine-based nonionic surfactant. The "fluorine-Si-based surfactant" used herein includes both requirements of a fluorine-based surfactant and a Si-based surfactant.

Examples of commercially available products of the fluorine-based nonionic surfactant include FLORADE FC-4430 and FC-4431, manufactured by Sumitomo 3M, Ltd., SURFLON S-241, S-242 and S-243, manufactured by Asahi Glass Co., Ltd., F TOP EF-PN31M-03, EF-PN31M-04, EF-PN31M-05, EF-PN31M-06 and MF-100, manufactured by Mitsubishi Materials Electronic Chemicals Co., Ltd., Polyfox PF-636, PF-6320, PF-656 and PF-6520, manufactured by OMNOVA Solutions Inc., FTERGENT 250, 251, 222F, 212M and DFX-18, manufactured by NEOS COMPANY LIMITED, UNIDYNE DS-401, DS-403, DS-406, DS-451 and DSN-403N, manufactured by DAIKIN INDUSTRIES, LTD., MEGAFAX F-430, F-444, F-477, F-553, F-556, F-557, F-559, F-562, F-565, F-567, F-569 and R-40, manufactured by DIC Corporation, and Capstone FS-3100 and Zonyl FSO-100, manufactured by DuPont.

In the case in which the photocurable composition of the present invention contains a surfactant, the content of the surfactant is preferably 0.1% to 10% by mass, more preferably 0.2% to 5% by mass, and even more preferably 0.5% to 5% by mass in the total composition excluding solvent. The photocurable composition may include only one surfactant or two or more surfactants. In the case of the photocurable composition including two or more surfactants, it is preferable that the total amount thereof is within the above range.

In addition, in the present invention, the photocurable composition may not substantially include the surfactant. The expression of not substantially containing the surfactant means that, for example, the content of the surfactant is preferably 0.01% by mass or less and more preferably 0.005% by mass or less, and even more preferably, the photocurable composition does not contain the surfactant.

<<Non-Polymerizable Compound>>

The photocurable composition may include a non-polymerizable compound which has at least one hydroxyl group at the terminal thereof or a polyalkylene glycol structure obtained by etherifying a hydroxyl group and does not substantially contain a fluorine atom and a silicon atom. Here, the non-polymerizable compound refers to a compound not having a polymerizable group. In addition, the expression of not substantially containing a fluorine atom and a silicon atom means that, for example, the total content proportion of a fluorine atom and a silicon atom is 1% or less, and the photocurable composition preferably does not substantially contain a fluorine atom and a silicon atom. When the photocurable composition does not substantially contain a fluorine atom and a silicon atom, the compatibility with the polymerizable compound is improved and particularly in the composition not containing the solvent, uniformity in coating, pattern formability during imprinting, and line edge roughness after dry etching are satisfactory.

As the polyalkylene structure of the non-polymerizable compound, a polyalkylene glycol structure including an alkylene group having 1 to 6 carbon atoms is preferable, a polyethylene glycol structure, a polypropylene glycol structure, a polybutylene glycol structure, or a mixed structure thereof is more preferable, a polyethylene glycol structure, a polypropylene glycol structure, or a mixed structure thereof is even more preferable, and a polypropylene glycol structure is particularly preferable.

Further, the compound may be substantially constituted of only a polyalkylene glycol structure excluding the substituent at the terminal. Here, the expression "substantially" refers that constitutional components the other than the polyalkylene glycol structure is 5% by mass or less and preferably 1% by mass or less with respect to the entirety. Particularly, it is particularly preferable that the photocurable composition includes a compound substantially constituted of only a polypropylene glycol structure as the non-polymerizable compound.

The polyalkylene glycol structure preferably has 3 to 100 alkylene glycol constitutional units, more preferably 4 to 50 alkylene glycol constitutional units, even more preferably 5 to 30 alkylene glycol constitutional units, and particularly preferably 6 to 20 alkylene glycol constitutional units.

It is preferable that the non-polymerizable compound has at least one hydroxyl group at the terminal thereof or has an etherified hydroxyl group. When the non-polymerizable compound has at least one hydroxyl group at the terminal thereof or has an etherified hydroxyl group, a hydroxyl group or a group in which the hydrogen atom of the terminal hydroxyl group is substituted may be used at the remaining terminal. As the group in which the hydrogen atom of the terminal hydroxyl group may be substituted, an alkyl group (that is, polyalkylene glycol alkyl ether) and an acyl group (that is, polyalkylene glycol ester) are preferable. More preferably is polyalkylene glycol in which all the terminals are hydroxyl groups. A compound having a plurality of (preferably two or three) polyalkylene glycol chains through a linking group can be also preferably used and the polyalkylene glycol chain is preferably a linear chain without being branched. Particularly, diol type polyalkylene glycol is preferable.

Preferable specific examples of the non-polymerizable compound include polyethylene glycol, polypropylene glycol, mono or dimethyl ethers thereof, mono or dibutyl ethers thereof, or mono or dioctyl ethers thereof, mono or dicetyl ethers thereof, monostearic acid ester, monooleic acid ester, polyoxy ethylene glyceryl ether, polyoxypropylene glyceryl ether, and trimethyl ethers thereof.

The weight-average molecular weight of the non-polymerizable compound is preferably 150 to 6,000, more preferably 200 to 3,000, more preferably 250 to 2,000, and even more preferably 300 to 1,200.

In the present invention, in the case in which the photocurable composition contains the non-polymerizable compound, the content of the non-polymerizable compound is preferably 0.1% to 20% by mass, more preferably 0.2% to 15% by mass, and even more preferably 0.5% to 10% by mass in the total composition excluding solvent. In addition, in the present invention, the photocurable composition may not substantially contain the non-polymerizable compound. The expression of not containing the non-polymerizable compound means that, for example, the content of the non-polymerizable compound is preferably 0.01% by mass or less and more preferably 0.005% by mass or less and even more preferably, the photocurable composition does not include the non-polymerizable compound.

The photocurable composition may not substantially include polymer components other than the non-polymerizable compound.

<<Solvent>>

The photocurable composition may contain a solvent. The content of the solvent in the photocurable composition is preferably 5% by mass or less and more preferably 3% by mass or less, and particularly preferably, the photocurable composition does not contain the solvent. Here, the expression of not substantially containing the solvent means that, for example, the content of the solvent with respect to the total mass of the photocurable composition 1% by mass or less.

In the case in which the photocurable composition is applied to a substrate or a mold by an ink jet method, when the amount of the solvent formulated is small, a change in the viscosity of the composition caused by volatilization of the solvent can be suppressed, and thus it is preferable that the amount of solvent is small.

The photocurable composition used in the present invention does not necessarily contain the solvent but the solvent may be optionally added when the viscosity of the composition is finely adjusted or the like. The type of the solvent that can be preferably used for the photocurable composition is not particularly limited as long as the solvent allows each component to be dissolved and uniformly dispersed and does not react with these components. Examples of the solvent include those described in paragraph 0088 of JP2008-105414A, the content of which is incorporated into the present specification.

<<Other Components>>

The photocurable composition may optionally include a polymerization inhibitor, a photosensitizer, an antioxidant, an ultraviolet absorbent, a light stabilizer, an aging preventing agent, a plasticizer, an adhesion promoter, a thermal polymerization initiator, a photobase generator, a coloring agent, an inorganic particle, an elastomer particle, a basic compound, a photo-acid generator, a photo-acid propagator, a chain transfer agent, an antistatic agent, a fluidity controlling agent, an anti-foaming agent, a dispersing agent, a release agent, and the like other than the above-described components. Specific examples of these components include those described in paragraphs 0092 and 0093 and 0099 to 0137 of JP2008-105414A, the content of which is incorporated into the present specification. In addition, the descriptions corresponding to WO2011/126101A, WO2013/051735A, JP2012-041521A, and JP2013-093552A can be referred to and the contents thereof are incorporated into the present specification.

The photocurable composition can be prepared by mixing each of the above-described components. Each component is typically mixed at a temperature within a range of 0° C. to 100° C. Further, it is preferable that each component is mixed and then filtered with a filter. The filtration may be performed in multiple stages or may be repeated multiple times. In addition, the filtrate can be filtered again.

Any filter can be used without particular limitation as long as the filter is conventionally used for filtration. For example, filters made of fluororesin such as polytetrafluoroethylene (PTFE), polyamide-based resin such as nylon-6 and nylon-6,6, and polyolefin resin such as polyethylene and polypropylene (PP) (including high density and ultrahigh molecular weight products) may be used. Among these materials, polypropylene (including high density polypropylene) and nylon are preferable.

A suitable pore size of filter is, for example, about 0.003 to 5.0 μm. With the pore diameter of filter controlled in the above range, while filtration clogging is suppress, fine foreign substances such as impurities and aggregates included in the composition can be reliably removed.

In the use of the filter, different filters may be used in combination. At this time, filtering that is performed using a first filter may be conducted only once or two or more times. In the case of performing filtering using difference filters in combination two or more times, it is preferable that the pore diameter of filters that are used after second filtering is equal to or smaller than the pore diameter of the filter used in the first filtering. Furthermore, first filters having different pore diameters within the above range may be combined with each other. For the pore diameter mentioned herein, the value officially measured by the filter maker can be referred to. As a commercially available filter, for example, the filter can be selected from various filters supplied from Pall Corporation Japan, Advantec Toyo Keisha Co., Ltd., Japan Entegris, Inc. (the former Japan Microlis), KITZ MICRO FILTER CORPORATION, and the like.

The viscosity of the photocurable composition at 25° C. is preferably 100 mPa·s or less, more preferably 70 mPa·s or less, even more preferably 50 mPa·s or less, and particularly preferably 30 mPa·s or less. The lower limit is preferably, for example, 1 mPa·s or more, more preferably 2 mPa·s or more, and even more preferably 3 mPa·s or more.

In the case of applying the photocurable composition by an ink jet method, the viscosity of the photocurable composition at 25° C. is preferably 15 mPa·s or less, more preferably 12 mPa·s or less, even more preferably 11 mPa·s or less, and particularly preferably 10 mPa·s or less. With the viscosity of the photocurable composition controlled in the above range, ink jet jetting accuracy and pattern formability can be improved.

In addition, in a permanent film (resist for structural members) used in liquid crystal displays (LCD) and the like, and a resist used for processing of a substrate for an electronic material, it is desirable that the resist is prevented as much as possible from being contaminated with ionic impurities of metals or organic substances in the resist so as not to interrupt the operation of a product. Therefore, in the case in which the porous body is used for the above application, the concentration of the ionic impurities of metals or organic substances in the photocurable composition is 1 ppm or less, preferably 100 ppb or less, and more preferably 10 ppb or less.

<Each Process of Method of Manufacturing Porous Body>

Next, each process of the method of manufacturing a porous body of the present invention is described.

The method of manufacturing a porous body of the present invention includes applying the above-described photocurable composition to a substrate or a mold, sandwiching the photocurable composition between the substrate and the mold and then irradiating the photocurable composition with light to cure the photocurable composition, and releasing the mold from a surface of the cured photocurable composition.

The present invention is preferably performed within a temperature range of 10° C. to 30° C. and a pressure range of 0.05 to 0.2 MPa except for the process of especially applying temperature and pressure as described later. Each process is described below.

<<Process of Applying Photocurable Composition>>

First, the above-described photocurable composition is applied to a substrate or a mold.

The method of applying the photocurable composition is preferably a coating method. Examples of the coating method include a dip coating method, an air knife coating method, a curtain coating method, a wire bar coating method, a gravure coating method, an extrusion coating method, a spin coating method, a slit scanning method, and an ink jet method.

The amount of the photocurable composition applied varies according the application of the porous body. For example, the film thickness after drying is preferably about 0.03 to 30 µm. In addition, the photocurable composition may be applied by multiple application. In the method of disposing liquid droplets on a substrate by an ink jet method, the amount of liquid droplets is preferably about 1 pl to 20 pl and the liquid droplets are preferably disposed on a substrate or a mold with intervals.

The substrate is not particularly limited and can be selected according to various applications. For example, materials including quartz, glass, optical film, ceramic material, vapor deposition film, magnetic film, reflective film, metal substrate of Ni, Cu, Cr, Fe or the like, paper, spin on carbon (SOC), spin on glass (SOG), polymer substrate such as polyester film, polycarbonate film or polyimide film, thin film transistor (TFT) array substrate, plasma display panel (PDP) electrode plate, conductive substrate of indium tin oxide (ITO), metal or the like, insulating substrate, and semiconductor preparing substrate such as silicon, silicon nitride, polysilicon, silicon oxide or amorphous silicon, may be used.

The shape of the substrate is not also particularly limited and a plate-like mold or a roll mold may be used. In addition, a light-transmitting substrate or a non-light-transmitting substrate can be selected according to a combination with a mold or the like.

As the substrate, a substrate having an underlayer film formed by applying a resin composition for forming an underlayer film to the surface of the substrate so as to improve adhesiveness with the photocurable composition may be used. For the resin composition for forming an underlayer film, for example, a composition including a polymerizable compound and a solvent is used. Examples of the resin composition for forming an underlayer film that can be used include those described in paragraphs 0017 to 0068 of JP2014-24322A, and paragraphs 0016 to 0044 of JP2013-93552A, the contents of which are incorporated into the present specification. The method of applying the resin composition for forming an underlayer film is preferably a coating method. Examples of the coating method include the above-described methods.

The mold may be a blank mold not having a pattern or a mold having a pattern to be transferred. In the case of using a blank mold not having a pattern, a porous body of a flat film can be manufactured. In addition, in the case of using a mold having a pattern, a porous body having a pattern (porous pattern formed body) can be manufactured.

The pattern on the mold can be formed according to desired processing accuracy by, for example, photolithography, electron beam lithography, or the like. For example, a pattern having a width of preferably 300 nm or less, more preferably 100 nm or less, and even more preferably 50 nm or less, is formed on the mold. When the line width of the pattern is small, a porous pattern formed body suitable for manufacturing a wiring structure can be obtained.

In addition, the aspect ratio of the pattern of the mold is preferably 0.1 to 10 and more preferably 1 to 5.

In addition, it is preferable that a multistage roughness pattern is formed on the mold. According to this embodiment, for example, it is possible to obtain a porous pattern formed body suitable for manufacturing a wiring structure. The multistage roughness pattern mans a stepped pattern in which the diameter of the projection portion is gradually reduced from the base end side (pattern bottom) toward the distal end side (pattern upper surface). For example, the pattern shown in FIG. 1 may be mentioned as an example.

The material for the mold is not particularly limited any material may be used as long as the material has a predetermined strength and durability. Specific examples thereof include glass, quartz, light-transmitting resin such as acrylic resin and as polycarbonate resin, transparent metal vapor deposition film, flexible film such as polydimethylsiloxane, photocured film, and metal film. In addition, in the case of using a light-transmitting substrate, a non-light-transmitting type mold can be used. The material for the non-light-transmitting type mold is not particularly limited as long as the material has a predetermined strength. Specific examples thereof include ceramic material, vapor deposition film, magnetic film, reflective film, metal substrate of Ni, Cu, Cr, Fe or the like, SiC, silicon, silicon nitride, polysilicon, silicon oxide, and amorphous silicon and these are not limitative. In addition, the shape of the mold is not also particularly limited and any of a plate-like mold or a roll mold may be used. The roll mold is used particularly in the case in which continuous productivity in transferring is required.

The mold to be used may be subjected to a release treatment in order to improve the releasability of the photocurable composition from the surface of the mold. Such a mold includes, for example, a mold treated by a silicone-based, fluorine-based, or other type of silane coupling agent. For example, commercially available release agents such as OPTOOL DSX, manufactured by Daikin Industries, Ltd., Novec EGC-1720, manufactured by Sumitomo 3M Ltd., and the like can be suitably used.

<<Process of Sandwiching Photocurable Composition Between Substrate and Mold>>

Next, the photocurable composition is sandwiched between the substrate and the mold. In the case of using the mold on which a pattern to be transferred is formed, the pattern formed in advance on the pressing surface of the mold can be transferred to the photocurable composition sandwiched between the substrate and the mold.

In the present invention, when the photocurable composition is sandwiched between the mold and the substrate, it is preferable that the condensing gas is introduced between the mold and the substrate and in the atmosphere of the presence of the condenscondensing gas, the photocurable composition applied to the substrate or the mold is sandwiched between the substrate and the mold. When such a method is used, it is possible to further promote removal of residual bubbles by utilizing a volume reduction through condensation of the introduced condensing gas. Examples of the condensing gas include the examples in the description of the above-described photocurable composition and these gases can be used. The condensing gas introduced between the mold and the substrate may be the same as or different from the condensing gas dissolved in the photocurable composition.

In addition, instead of using the condensing gas, a helium gas may be introduced between the mold and the substrate, and in the atmosphere of the presence of the helium gas, the photocurable composition applied to the substrate or the mold may be sandwiched between the substrate and the mold. When such a method is used, it is possible to promote gas permeation into the quartz mold and to promote removal of residual bubbles. In addition, it is possible to suppress inhibition of radical polymerization at exposure by reducing the amount of dissolved oxygen in the photocurable composition.

Further, the helium gas and the condensable gas may be introduced between the substrate and the mold, and in the atmosphere of the presence of the helium gas and the condensing gas, the photocurable composition applied to the substrate or the mold may be sandwiched between the substrate and the mold.

<<Process of Irradiating Photocurable Composition with Light>>

Next, the photocurable composition sandwiched between the substrate and the mold is irradiated with light to cure the photocurable composition. The irradiation dose for photoirradiation may be sufficiently larger than the irradiation dose required for the curing of the photocurable composition. The irradiation dose required for the curing is determined to be appropriate by investigating the amount of consumption of the unsaturated bond of the photocurable composition and the tackiness of the cured film.

The photoirradiation is performed typically at a substrate temperature of room temperature and may be performed while performing heating to enhance the reactivity. When a vacuum state is made as a preceding stage for photoirradiation, the effect of preventing mixing of bubbles, suppressing deterioration in reactivity caused by mixing of oxygen, and improving adhesiveness between the mold and the photocurable composition is exhibited and thus the photoirradiation may be performed in a vacuum state. The pressure during photoirradiation is preferably within a range of $10^{-1}$ Pa to 0.1 MPa.

The light used for curing the photocurable composition is not particularly limited and examples thereof include high-energy ionizing radiation, and light having a wavelength in the near-ultraviolet region, far-ultraviolet region, visible region, infrared region, radiation, and the like. As a source of the high-energy ionizing radiation, for example, an electron beam accelerated by an accelerating device such as a Cockcroft accelerator, Van de Graaff accelerator, linear accelerator, betatron or cyclotron is used most economically and conveniently from an industrial point of view; besides, a radioactive isotope, or radiation such as a γ-ray, X-ray, α-ray, neutron beam or proton beam, emitted from a reactor or the like, can be also used. Examples of ultraviolet light sources include ultraviolet fluorescent lamps, low-pressure mercury lamps, high-pressure mercury lamps, ultrahigh-pressure mercury lamps, xenon lamps, carbon-arc lamps, and sunlamps. Examples of the radiation include microwaves and extreme ultraviolet rays (EUV). Besides, light produced by an light emitting diode (LED), semiconductor laser light, and laser light used in fine processing of semiconductors such as KrF excimer laser light having a wavelength of 248 nm and ArF excimer laser light having a wavelength of 193 nm can be suitably used in the present invention. As such light, monochromatic light or light (mixed light) having a plurality of different wavelengths may be used.

When exposure is performed, the exposure illuminance is desirably within a range of 1 to 50 mW/cm². When the exposure illuminance is 1 mW/cm² or more, the exposure time can be reduced and thus the productivity is improved. When the exposure illuminance is 50 mW/cm² or less, deterioration in the properties of the permanent film caused by the occurrence of side reaction is likely to be suppressed. Thus, the above range is preferable. The amount of exposure is desirably within a range of 5 to 1,000 mJ/cm². With the exposure illuminance controlled to be within this range, the curability of the photocurable composition is satisfactory. Further, when exposure is performed, in order to prevent inhibition of radical polymerization by oxygen, the oxygen concentration may be controlled to be less than 100 mg/L by allowing an inert gas such as nitrogen or argon to flow.

After the photocurable composition is cured by the photoirradiation, as required, the method may further include a process of further curing the photocurable composition by heating. The heating temperature is preferably, for example, 150° C. to 280° C. and more preferably 200° C. to 250° C. In addition, the heating time is preferably, for example, 5 to 60 minutes and more preferably 15 to 45 minutes.

<<Process of Releasing Mold>>

After the photocurable composition is cured as described above, the mold is released from the surface of the photocurable composition to form a porous body on the substrate along the shape of the mold.

The method of releasing the mold may be a method not causing defects in a porous body to be obtained. For example, a method of gradually releasing the mold from the edge portion of the substrate, a method of releasing the mold while applying pressure from the mold by reducing a force applied to a porous body at the boundary at which the mold is released from the porous body, and the like can be used. Further, a method of releasing the mold by heating the vicinity of the porous body can be also applied. A composite method of combining the above methods may be also used.

The porous body obtained in the present invention may have a pattern. That is, the porous body obtained in the present invention may be a porous pattern formed body.

The pattern size of the porous body varies according to the application. For example, the porous body preferably has a pattern having a width of 300 nm or less, more preferably has a pattern having a width of 100 nm or less, and even more preferably has a pattern having a width of 50 nm or less. In addition, the aspect ratio of the pattern is preferably 0.1 to 10 and more preferably 1 to 5.

The porous body is preferably a porous pattern formed body having a multistage roughness pattern.

The specific dielectric constant of the porous body at 25° C. is preferably 3.4 or less and more preferably 3.2 or less. In the present specification, the value of the specific dielectric constant is a value measured by the method shown in Examples, which will be described later.

The details of the imprint method can refer to paragraphs 0103 to 0115, the contents of which are incorporated into the specification of JP2010-109092A (corresponding to US2011/199592A).

The porous body (porous pattern formed body) having a pattern obtained in the present invention can be used for manufacturing a device or a wiring structure by removing the residual film and introducing a wiring material such as copper into the pattern without undergoing complicated photolithography and etching process. Further, in the present invention, a rectangular pattern delicately matched to the mold can be formed and thus a multistage wiring structure typically formed by repeating photolithography and etching (such as dual damascene structure) can be also manufactured with few processes by using the porous pattern formed body obtained in the present invention as an insulating film.

<Porous Body Manufacturing System>

Next, a porous body manufacturing system for realizing the above-described method of manufacturing a porous body is described.

Figure 3:
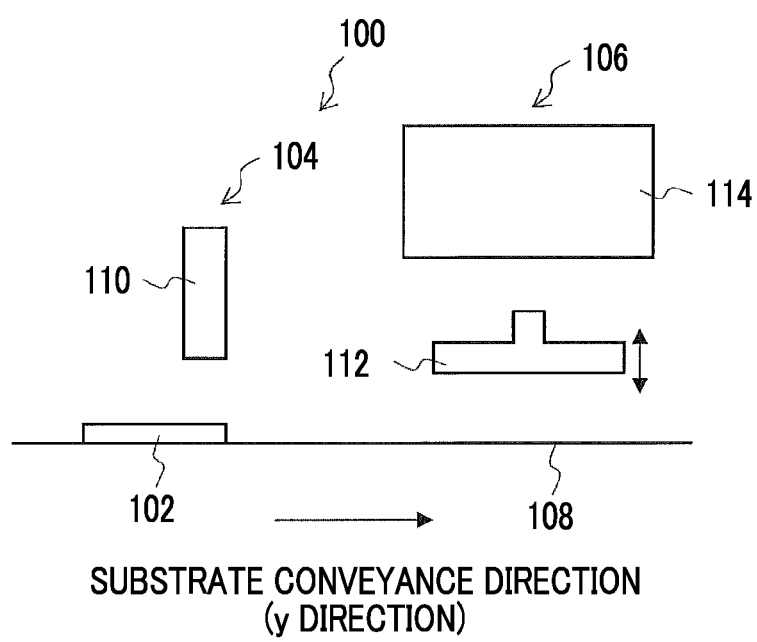
FIG. 3 is a schematic view showing a porous body manufacturing system.

FIG. 3 is a schematic view showing the configuration of a porous body manufacturing system. A porous body manufacturing system 100 shown in FIG. 3 includes a photocurable composition applying unit 104 which applies a photocurable composition to a substrate 102, a porous body forming unit 106 provided with a mold 112 and a photoirradiation device 114, and a conveyance unit 108 which conveys the substrate 102.

The conveyance unit 108 includes conveyance means which fixes and conveys the substrate 102, such as a conveyance stage, for example, and conveys the substrate 102 in a direction from the photocurable composition applying unit 104 to the porous body forming unit 106 (hereinafter, also referred to as "y direction" or "substrate conveyance direction") while holding the substrate 102 on the surface of the conveyance means. As a specific example of the conveyance means, it is possible to adopt a combination of a linear motor and an air slider, or a combination of a linear motor and a linear motion guide, or the like. It is also possible to adopt a configuration in which either the photocurable composition applying unit 104 or the porous body forming unit 106, or both, are moved, instead of moving the substrate 102.

The photocurable composition applying unit 104 may adopt, for example, an ink jet device which includes an ink jet head 110 in which a plurality of nozzles are formed, and applies the photocurable composition to the surface of the substrate 102 by jetting liquid droplets of the photocurable composition though the respective nozzles.

The ink jet head 110 may adopt a serial type head having a structure in which a plurality of nozzles are arranged in the y direction and liquid jetting is performed in the x direction by performing a scanning action throughout the entire width of the substrate 102 in the x direction, or a long full line head having a structure in which a plurality of nozzles are arranged in a row through the maximum width of the substrate 102 in the x direction, which is perpendicular to the y direction.

In the liquid jetting using the serial type head, when the liquid jetting in the x direction ends, the next liquid jetting in x direction is performed by performing an operation of moving the substrate and the head relatively to each other in y direction. By repeating the operation in this manner, the liquid droplets are jetted throughout the entire surface of the substrate. However, in the case in which the length of the substrate in the y direction can be handled by one scanning operation in x direction, the relative movement of the substrate and the head in the y direction is not required.

In the liquid jetting using the full line type head, it is possible to arrange the liquid droplets at desired positions on the substrate by performing just one operation of moving the substrate and the head relatively to each other in the substrate convey direction without moving the head in the x direction and thus it is possible to raise the photocurable composition application rate.

The details of the ink jet head can refer to paragraphs 0057 to 0130 of JP2012-11310A, the content of which is incorporated into the present specification.

In the case of applying the photocurable composition by the ink jet method, application devices may be used according to various application methods. In the case of applying the photocurable composition by a spin coating method, a spin coating device is used instead of using an ink jet device.

The porous body forming unit 106 includes the mold 112 and the photoirradiation device 114 which applies light.

The mold 112 may be a blank mold not having a pattern or may have a pattern to be transferred. By using the mold having a pattern, a porous body (porous pattern formed body) having a pattern can be manufactured.

In the porous body forming unit 106, in a state in which the mold 112 is pressed against the surface of the substrate 102 to which the photocurable composition is applied, photoirradiation is performed from the rear side of the substrate 102 to cure the photocurable composition on the substrate 102, and the mold is released from the surface of the cured photocurable composition to form a porous body.

The mold 112 is configured to be movable in the vertical direction in FIG. 3 (in the direction indicated by the arrow line) and the mold is moved downward while maintaining a state in which the surface of the mold 112 (in the case of the mold having a pattern, pattern forming surface) is substantially parallel with the surface of the substrate 102 and is pressed so as to be in contact with the entire surface of the substrate 102 virtually simultaneously.

The porous body forming unit 106 further includes an atmospheric gas supply nozzle which supplies one or more atmospheric gases selected from a condensing gas and a helium gas, and the porous body forming unit is preferably configured to press the mold 112 against the surface of the substrate 102 to which the photocurable composition is applied in the presence of one or more atmospheric gases selected from a condensing gas and a helium gas.

<Porous Body and Application Thereof>

Next, the porous body of the present invention is described,

The porous body of the present invention includes a (meth)acrylic resin, and the specific dielectric constant thereof at 25° C. is 3.4 or less. The specific dielectric constant of the porous body is preferably 3.4 or less and more preferably 3.2 or less.

Figure 2:
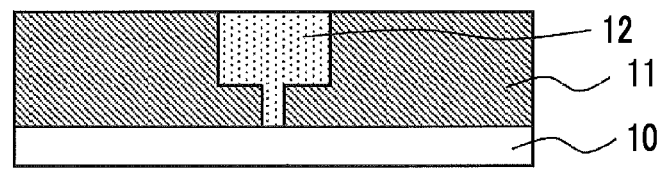
FIG. 2 is a schematic view showing a wiring structure of a dual damascene structure.

The porous body of the present invention preferably has a pattern and more preferably has a multistage roughness pattern. The porous body (porous pattern formed body) having a multistage roughness pattern can be preferably used as an insulating film for forming a wiring structure of a dual damascene structure. An example of the wiring structure of a dual damascene structure includes a wiring structure shown in FIG. 2. In the wiring structure shown in FIG. 2, the wiring layer 12 is formed by filling the concave portion of a porous pattern formed body 11 which is formed on the substrate 10 and constituted with a multistage roughness pattern with a wiring material.

The porous body of the present invention can be formed by using a photocurable composition including a (meth) acrylate compound as the polymerizable compound in the above-described method of manufacturing a porous body. In addition, the multistage roughness pattern can be formed by using a mold having a multistage roughness pattern.

The porous body of the present invention can be preferably used as an insulating film for various devices such as a large scale integrated circuit (LSI).

The porous body can be also preferably used as an insulating film in the wiring structure. Examples of the wiring structure include a structure having a porous body and a wiring layer.

<Method of Manufacturing Device>

The method of manufacturing a device of the present invention includes the above-described method of manufacturing a porous body. That is, a device can be manufactured by applying a method of forming a porous body according to the above-described method and then using the porous body to manufacturing of various devices. Examples of the device include a semiconductor device such as a large scale integrated circuit (LSI).

<Method of Manufacturing Wiring Structure>

The method of manufacturing a wiring structure of the present invention includes the above-described method of manufacturing a porous body. That is, a wiring structure having an insulating film constituted with a porous body and a wiring layer can be manufactured by forming a porous body (preferably a porous pattern formed body) and then introducing a wiring material such as copper into the pattern to form a wiring layer. The method of forming a wiring layer is not particularly limited. For example, methods such as electroless plating and electrolytic plating may be used.

The porous body obtained in the present invention can be suitably used as a permanent film used for a liquid display device (LCD) or the like such as an overcoat layer or an insulating film, and an etching resist for a semiconductor integrated circuit, a recording material, and a flat panel display. The porous body can be also used for a resin mold, a water repellent film, a hydrophilic film, and the like.

Example

Hereinafter, the present invention is described in more detail using example. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples. Also, unless otherwise specified, "part(s)" and "%" are based on mass.

<Preparation of Photocurable Composition>

(Photocurable Compositions Used in Examples 1 to 4)

Raw materials shown in the table below were mixed and filtered with a 0.1 μm polytetrafluoroethylene (PTFE) filter and thus each photocurable composition was prepared.

Thereafter, each composition was moved to a glove box and weighed with an electronic balance to measure the weight. Then, the glove box was filled with 1,1,1,3,3-pentafluoropropane (SP value=13 $(J/cm^3)^{1/2}$) as a condensing gas. After a change in the mass of the composition moved into the glove box reached 0.1% by mass/min, the composition was taken out from the glove box to prepare a photocurable composition in which the condensing gas was dissolved. The state in which the change in the mass of the composition in the glove box is 0.1% by mass/min is a state in which the condensing gas is dissolved to be saturated in the composition.

While the condensing gas was being dissolved in the composition, the condensing gas concentration inside the glove box was kept almost constant by continuously supplying the condensing gas into the glove box.

<Preparation of Photocurable Composition>

(Photocurable Compositions Used in Comparative Examples 1 to 5)

Raw materials shown in the table below were mixed and filtered with a 0.1 μm polytetrafluoroethylene (PTFE) filter and thus each photocurable composition was prepared.

The photocurable compositions used in Comparative Examples 1 to 5 are photocurable compositions not including a condensing gas.

<Production of Test Piece>

Using an ink jet device (DMP-2831, manufactured by FUJIFILM Dimatix Inc.), each photocurable composition was applied to a silicon wafer. The liquid droplet size was 6 pL and the composition was applied in a square lattice shape at an interval of 140 μm.

Next, the quartz mold with an untransferred pattern was fixed to have an interval of 1 μm from the silicon wafer and the atmospheric gas shown in the following table was blown into the gap. The mold made contact with the substrate at a pressure of 0.15 MPa within 10 seconds after the atmospheric gas was blown and left to stand for 30 seconds at 25° C. and 0.1 MPa (atmospheric pressure) and the photocuring was performed from the surface of the quartz mold by using a high-pressure mercury lamp. The irradiation dose was 100 $mJ/cm^2$.

A test piece having a film thickness of 200 to 300 nm was produced by releasing the quartz mold after curing.

<Measurement of Specific Dielectric Constant>

The specific dielectric constant of the test piece produced according to the above-described method was measured by using a mercury probe CVmap 92A (manufactured by Four Dimensions. Inc.). The specific dielectric constant of the test piece was measured at three points of a region with a measurement area of 0.014 $cm^2$ at 25° C. to obtain the average value thereof. The average value was set to the specific dielectric constant of the test piece.

TABLE 1

| | | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|
| Composition | A-1 | 100 | 100 | | | 100 | | | 70 | 50 |
| | A-2 | | | 100 | 100 | | 100 | | | |

TABLE 1-continued

|  | Example 1 | Example 2 | Example 3 | Example 4 | Comparative Example 1 | Comparative Example 2 | Comparative Example 3 | Comparative Example 4 | Comparative Example 5 |
| --- | --- | --- | --- | --- | --- | --- | --- | --- | --- |
| A-3 |  |  |  |  |  |  | 100 | 30 | 50 |
| B-1 | 2 | 2 | 2 | 2 | 2 | 2 | 2 | 2 | 2 |
| C-1 |  |  |  |  |  |  |  |  |  |
| Type of gas dissolved | PFP | PFP | PFP | PFP |  |  |  |  |  |
| Amount of mass increased by dissolution of condensing gas | 1.45 | 1.45 | 1.51 | 1.51 |  |  |  |  |  |
| Atmospheric gas at the time of contact | PFP | He | PFP | He | He | He | He | He | He |
| Film thickness (nm) | 210 | 221 | 221 | 221 | 212 | 222 | 239 | 220 | 220 |
| Specific dielectric constant | 2.8 | 2.9 | 2.9 | 3.0 | 3.5 | 3.6 | 3.8 | 3.6 | 3.7 |

In Examples 1 to 4 in which the photocurable compositions including a condensing gas and a polymerizable compound were used, the test pieces of the porous bodies could be produced. In addition, the test pieces of Examples 1 to 4 had a low specific dielectric constant.

In contrast, in Comparative Examples 1 to 5 using the photocurable compositions not including a condensing gas, the test pieces of the porous bodies could not be produced.

Whether the test piece was a porous body or not was confirmed by observing the cross section of the test piece with a scanning electron microscope.

In addition, in the preparation of the test piece, a porous body having a pattern having a line width of 30 nm could be manufactured by using a quartz mold having a Line/Space pattern having a line width of 30 nm and a depth of 60 nm as a mold.

Further, in the preparation of the test piece, a porous body having a multistage roughness pattern could be manufactured by using a quartz mold having a multistage roughness pattern as a mold.

(Example 5)

When the test piece was produced under the same conditions as in the above <Production of Test Piece> except that the chemical obtained by dissolving the composition of Example 1 in polypropylene glycol monoethylether (concentration of solid contents: 5% by mass) was applied to a Si substrate with an adhesive agent by spin coating (for 30 seconds at 1,000 rpm) and dried on a hot plate heated to at 80° C. for one minute, the test piece of a porous body could be produced. In addition, when the specific dielectric constant of the obtained test piece was measured according to the method of the above <Measurement of Specific Dielectric Constant>, the specific dielectric constant was 2.8.

The "Amount of mass increased by dissolution of condensing gas" in the table is as follows.

Amount of mass increased by dissolution of condensing gas=(mass (g) of composition after condensing gas dissolved/mass (g) of composition before condensing gas dissolved)

The symbols in the table are as follows.
(Polymerizable Compound)
A-1: Compound below (synthesized by using α,α'-dichloro-p-xylene and acrylic acid, SP value=21 $(J/cm^3)^{1/2}$)

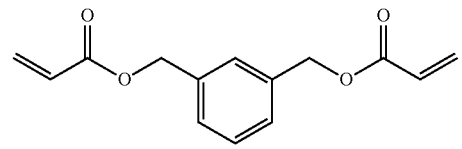 [SMILES: C=CC(=O)OCc1cccc(COC(=O)C=C)c1]

A-2: 1,6-hexanediol diacrylate (SP value=19 $(J/cm^3)^{1/2}$)
A-3: glycerol 1,3-diglycerol diacrylate (SP value=25 $(J/cm^3)^{1/2}$) (Photopolymerization Initiator)
B-1: IRGACURE 819 (manufactured by BASF SE) (Surfactant)
C-1: Capstone FS-3100 (manufactured by Dupont) (Gas)
PFP: 1,1,1,3,3-pentafluoropropane
He: helium

EXPLANATION OF REFERENCES

10: substrate
11: porous pattern formed body
12: wiring layer
100: porous body manufacturing system
102: substrate
104: photocurable composition applying unit
106: porous body forming unit
108: conveyance unit
110: ink jet head
112: mold
114: photoirradiation device

What is claimed is:
1. A method of manufacturing a porous body comprising:
applying a photocurable composition including a condensing gas and a polymerizable compound to a substrate or a mold;
sandwiching the photocurable composition between the substrate and the mold and then irradiating the photocurable composition with light to cure the photocurable composition; and
releasing the mold from a surface of the cured photocurable composition;
wherein the method further comprises, before the applying, leaving the photocurable composition to stand for a predetermined period of time in a closed space in which the condensing gas is present;
the condensing gas is a gas having a pressure of 0.05 to 1 MPa for achieving gas-liquid equilibrium at 25° C.;
the polymerizable compound has a ΔSP, which is represented by the following Equation (1), of 15 $(J/cm^3)^{1/2}$ or less:

ΔSP=|solubility parameter (SP) value of polymerizable compound−SP value of condensing gas included in photocurable composition|. . . (1);

a second condensing gas is introduced between the mold and the substrate at the sandwiching; and the second condensing gas is different from the condensing gas dissolved in the photocurable composition.

2. The method of manufacturing a porous body according to claim 1, wherein the polymerizable compound having a ΔSP, which is represented by the following Equation (1), of 15 $(J/cm^3)^{1/2}$ or less is 50 to 100% by mass with respect to a total polymerizable compound included in the photocurable composition.

3. The method of manufacturing a porous body according to claim 1, wherein the condensing gas is dissolved to be saturated in the photocurable composition.

4. The method of manufacturing a porous body according to claim 1, wherein the mold has a pattern.

5. The method of manufacturing a porous body according to claim 1, wherein the mold has a pattern having a line width of 50 nm or less.

6. The method of manufacturing a porous body according to claim 1, wherein the mold has a multistage roughness pattern.

7. The method of manufacturing a porous body according to claim 1, wherein in an atmosphere of the presence of one or more gases selected from a condensing gas and a helium gas, the photocurable composition applied to the substrate or the mold is sandwiched between the substrate and the mold.

8. A method of manufacturing a device comprising:

the method of manufacturing a porous body according to claim 1.

9. A method of manufacturing a wiring structure comprising:

the method of manufacturing a porous body according to claim 1.

10. The method of manufacturing a porous body according to claim 1, wherein a specific dielectric constant at 25° C. of the porous body is 3.4 or less.

* * * * *